United States Patent
Chung et al.

(10) Patent No.: US 9,788,418 B2
(45) Date of Patent: Oct. 10, 2017

(54) CONDUCTIVE TRANSPARENT SUBSTRATE MANUFACTURING METHOD, AND CONDUCTIVE TRANSPARENT SUBSTRATE

(71) Applicant: INKTEC Co., Ltd., Gyeonggi-do (KR)

(72) Inventors: Kwang-Choon Chung, Gyeonggi-do (KR); Ji Hoon Yoo, Gyeonggi-do (KR); Joonki Seong, Gyeonggi-do (KR); Byung Hun Kim, Gyeonggi-do (KR); Nam-Boo Cho, Gyeonggi-do (KR); Myung-Bong Yoo, Gyeonggi-do (KR)

(73) Assignee: INKTEC CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/902,980

(22) PCT Filed: Jul. 7, 2014

(86) PCT No.: PCT/KR2014/006040
§ 371 (c)(1),
(2) Date: Mar. 11, 2016

(87) PCT Pub. No.: WO2015/002515
PCT Pub. Date: Jan. 8, 2015

(65) Prior Publication Data
US 2016/0192477 A1    Jun. 30, 2016

(30) Foreign Application Priority Data
Jul. 5, 2013  (KR) .................... 10-2013-0079247

(51) Int. Cl.
*H01K 1/02* (2006.01)
*H05K 3/00* (2006.01)
(Continued)

(52) U.S. Cl.
CPC ........... *H05K 1/0274* (2013.01); *G06F 3/041* (2013.01); *H01L 51/445* (2013.01);
(Continued)

(58) Field of Classification Search
CPC .... H05K 1/0274; H05K 3/067; H05K 1/0298; H05K 1/0213; H05K 1/0306;
(Continued)

(56) References Cited

U.S. PATENT DOCUMENTS

2013/0050105 A1    2/2013  Lee et al.
2013/0063371 A1    3/2013  Lee et al.
(Continued)

FOREIGN PATENT DOCUMENTS

JP    2000338512 A    12/2000
JP    2005310972 A    11/2005
(Continued)

OTHER PUBLICATIONS

International Search Report in International Application No. PCT/KR2014/006040, dated Jul. 7, 2014.

*Primary Examiner* — Timothy Thompson
*Assistant Examiner* — Charles Pizzuto
(74) *Attorney, Agent, or Firm* — Saliwanchik, Lloyd & Eisenschenk

(57) ABSTRACT

Provided herein is a method for manufacturing a conductive transparent substrate, the method including forming a plurality of main electrodes on the substrate such that the main electrodes are distanced from one another; and forming a connecting electrode that electrically connects two or more main electrodes such that the plurality of main electrodes are grouped into a plurality of group electrodes that are electrically disconnected from one another, thereby producing a conductive transparent substrate with excellent transmittance in a process of high yield.

18 Claims, 12 Drawing Sheets

(51) Int. Cl.
*H05K 1/09* (2006.01)
*H05K 3/12* (2006.01)
*H05K 3/06* (2006.01)
*H05K 1/03* (2006.01)
*H05K 1/02* (2006.01)
*G06F 3/041* (2006.01)
*H01L 51/44* (2006.01)

(52) U.S. Cl.
CPC .......... *H05K 1/0213* (2013.01); *H05K 1/0298* (2013.01); *H05K 1/032* (2013.01); *H05K 1/034* (2013.01); *H05K 1/0306* (2013.01); *H05K 1/0346* (2013.01); *H05K 1/097* (2013.01); *H05K 3/0026* (2013.01); *H05K 3/067* (2013.01); *H05K 3/12* (2013.01); *H05K 2201/0776* (2013.01); *Y02E 10/549* (2013.01); *Y02P 70/521* (2015.11)

(58) Field of Classification Search
CPC ...... H05K 1/034; H05K 1/0346; H05K 1/032; H05K 1/097; H05K 3/12; H05K 3/0026

USPC ................. 174/257; 216/13; 29/846, 847
See application file for complete search history.

(56) References Cited

U.S. PATENT DOCUMENTS

2014/0217059 A1* 8/2014 Park ................. G06F 3/0412
216/13
2016/0041649 A1* 2/2016 Uchida ............... G06F 3/044
345/174

FOREIGN PATENT DOCUMENTS

| KR | 10-2000-0059089 A | | 7/2000 |
| KR | 1020090082965 A | | 8/2009 |
| KR | 1020130021648 A | | 3/2013 |
| KR | 1020130027747 | * | 3/2013 |
| KR | 1020130027747 A | | 3/2013 |

* cited by examiner

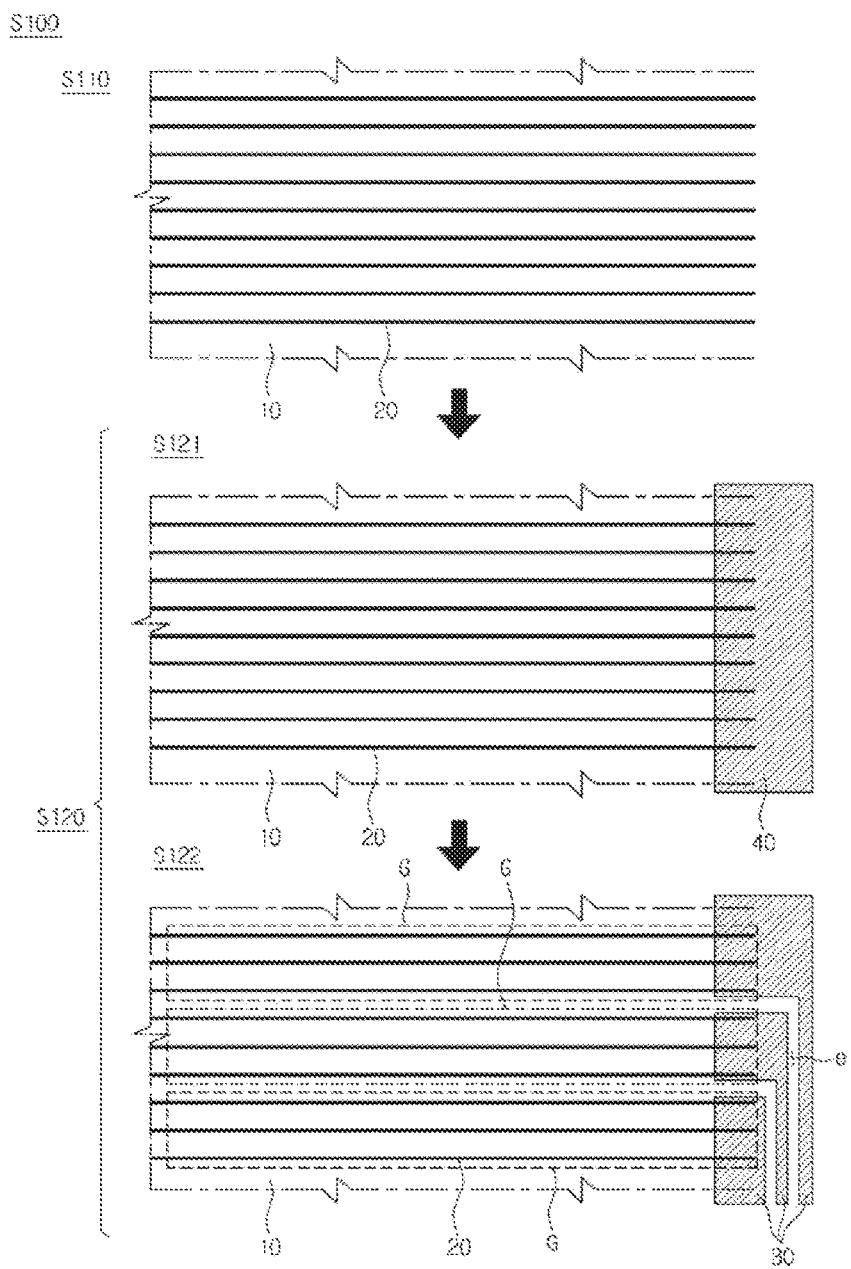
[FIG. 1]

[FIG. 2]
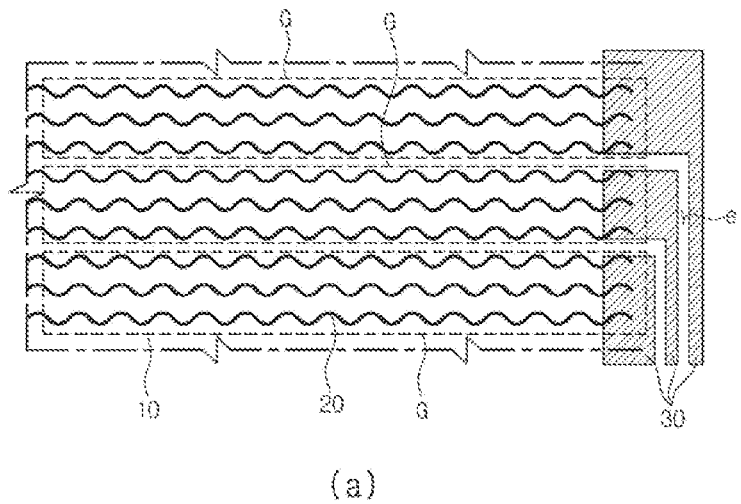
(a)
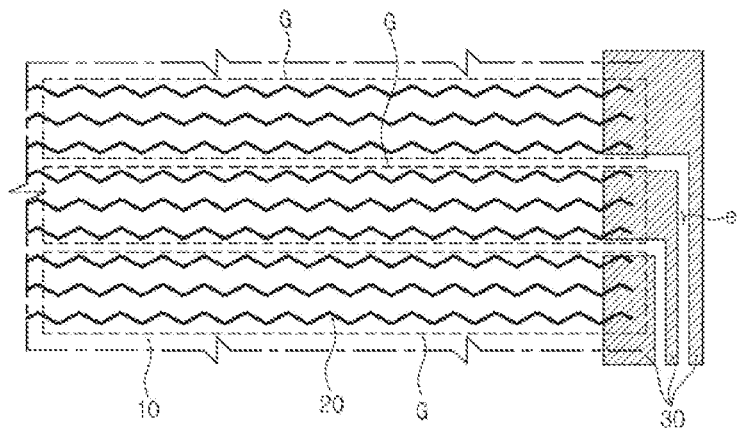
(b)

[FIG. 3]
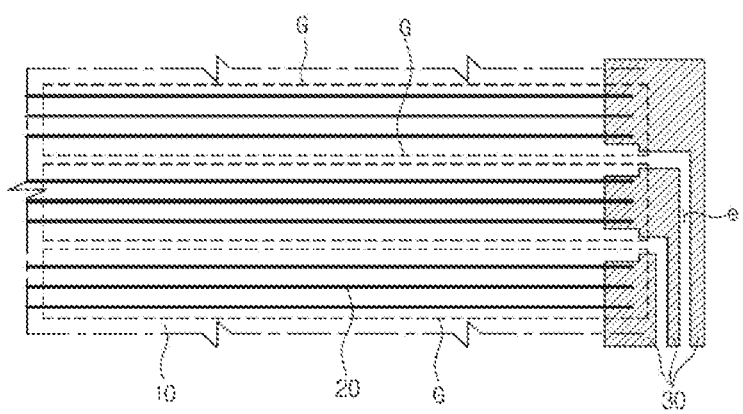
(a)
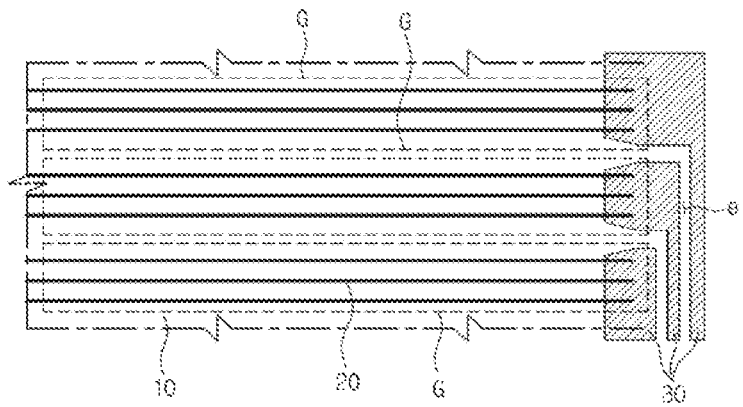
(b)

[FIG. 4]
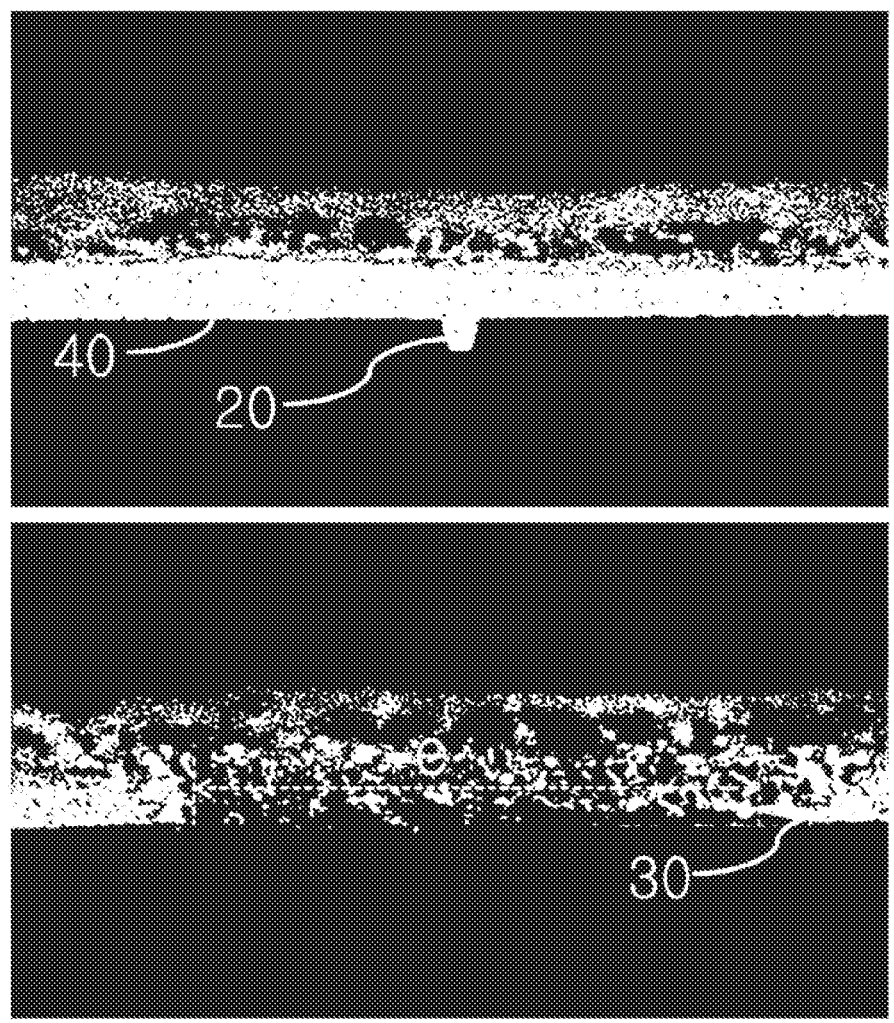

[FIG. 5]
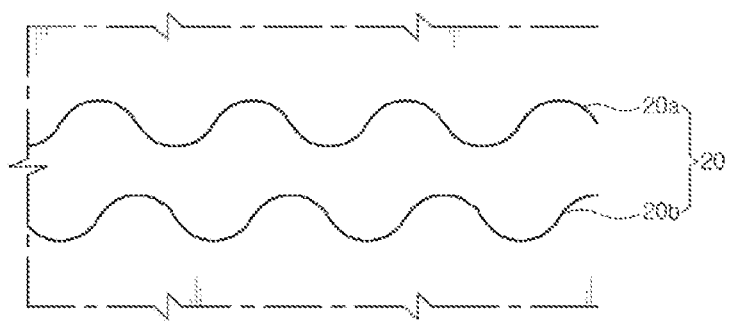
(a)
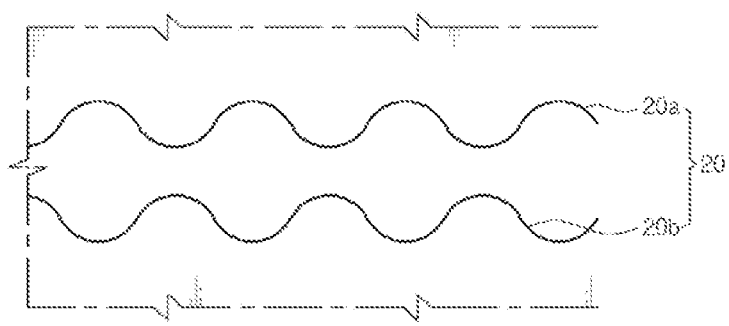
(b)

[FIG. 6]
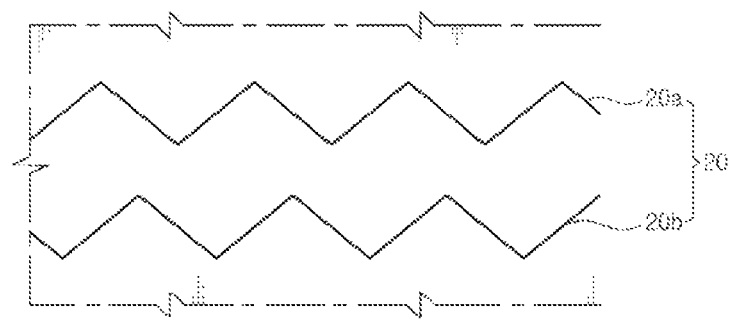
(a)
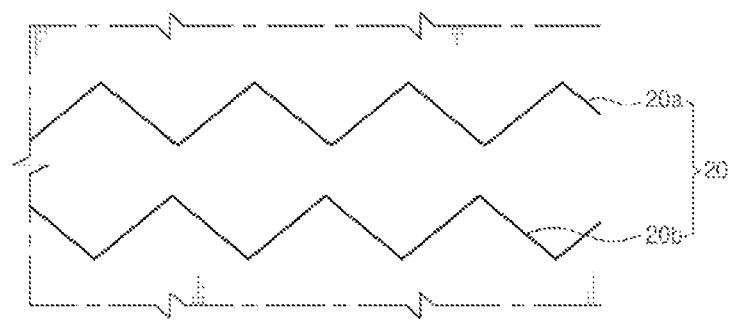
(b)

[FIG. 7]
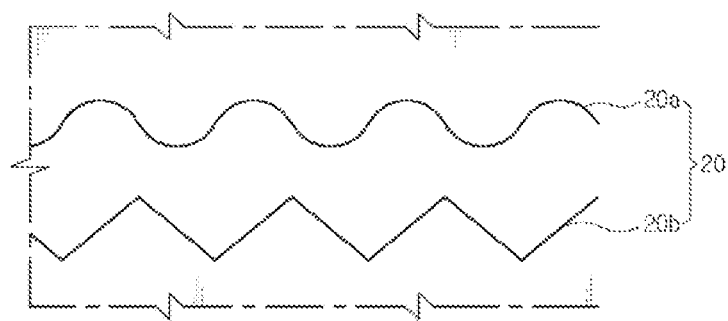
(a)
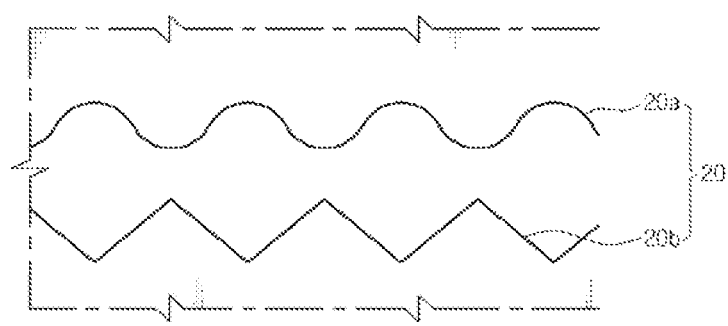
(b)

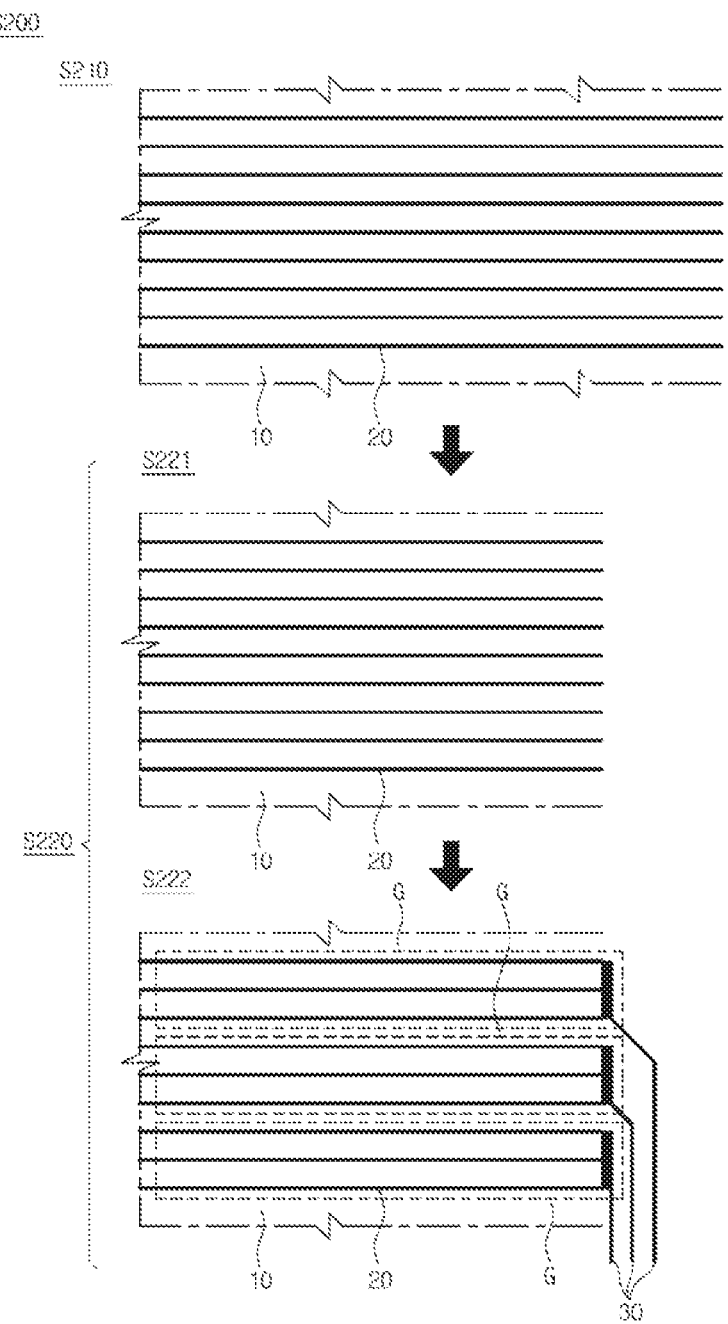
[FIG. 8]

[FIG. 9]
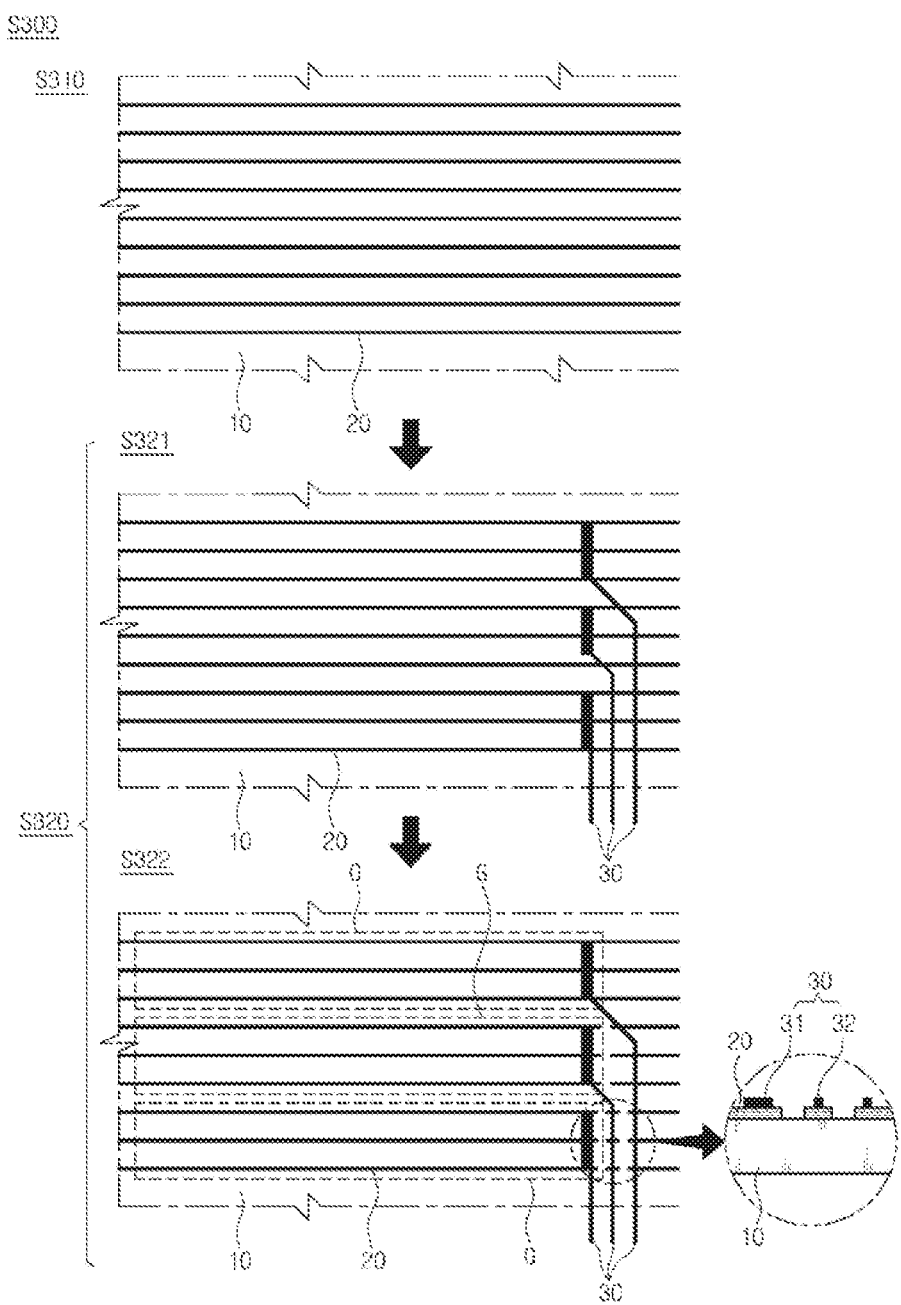

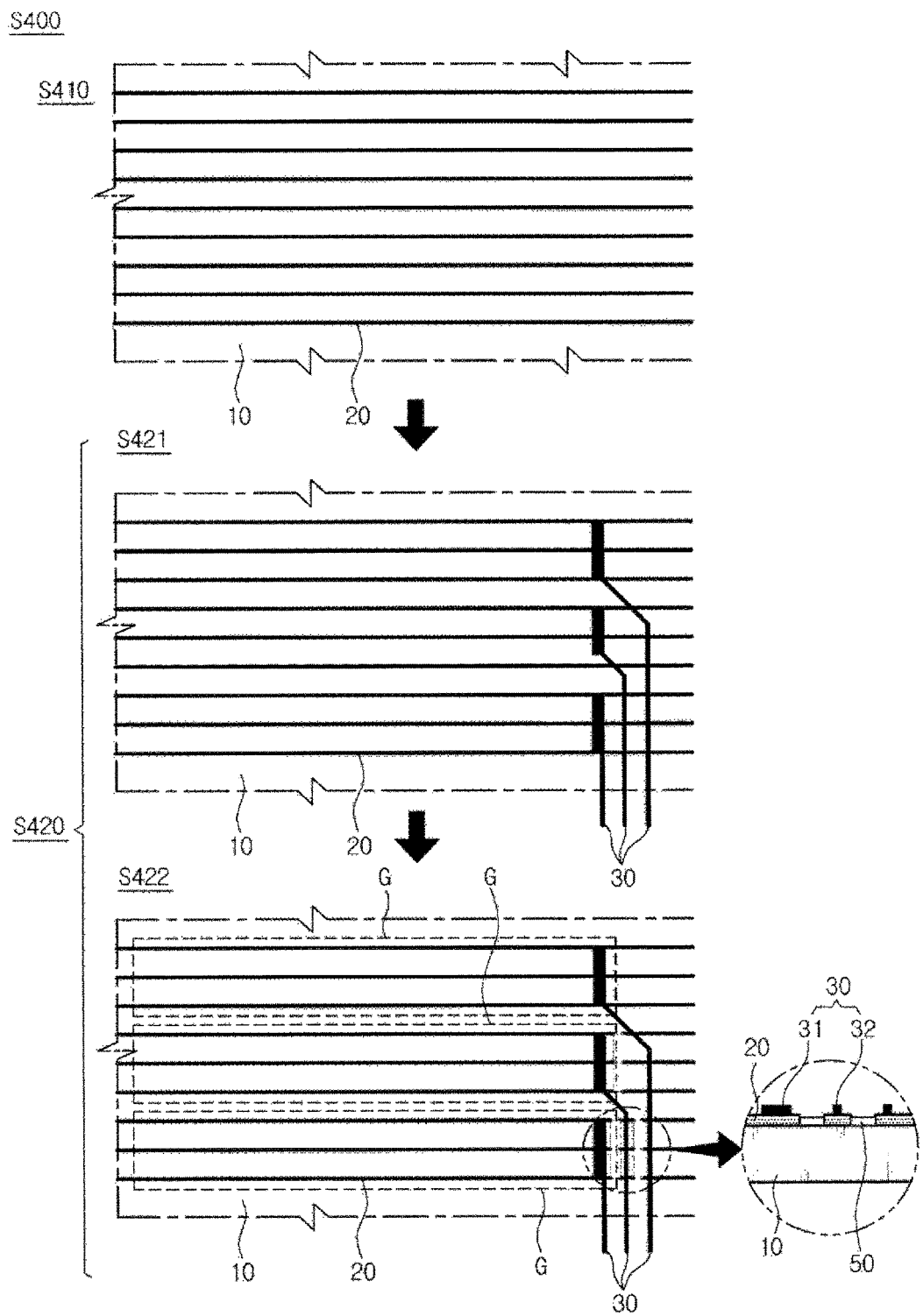
[FIG. 10]

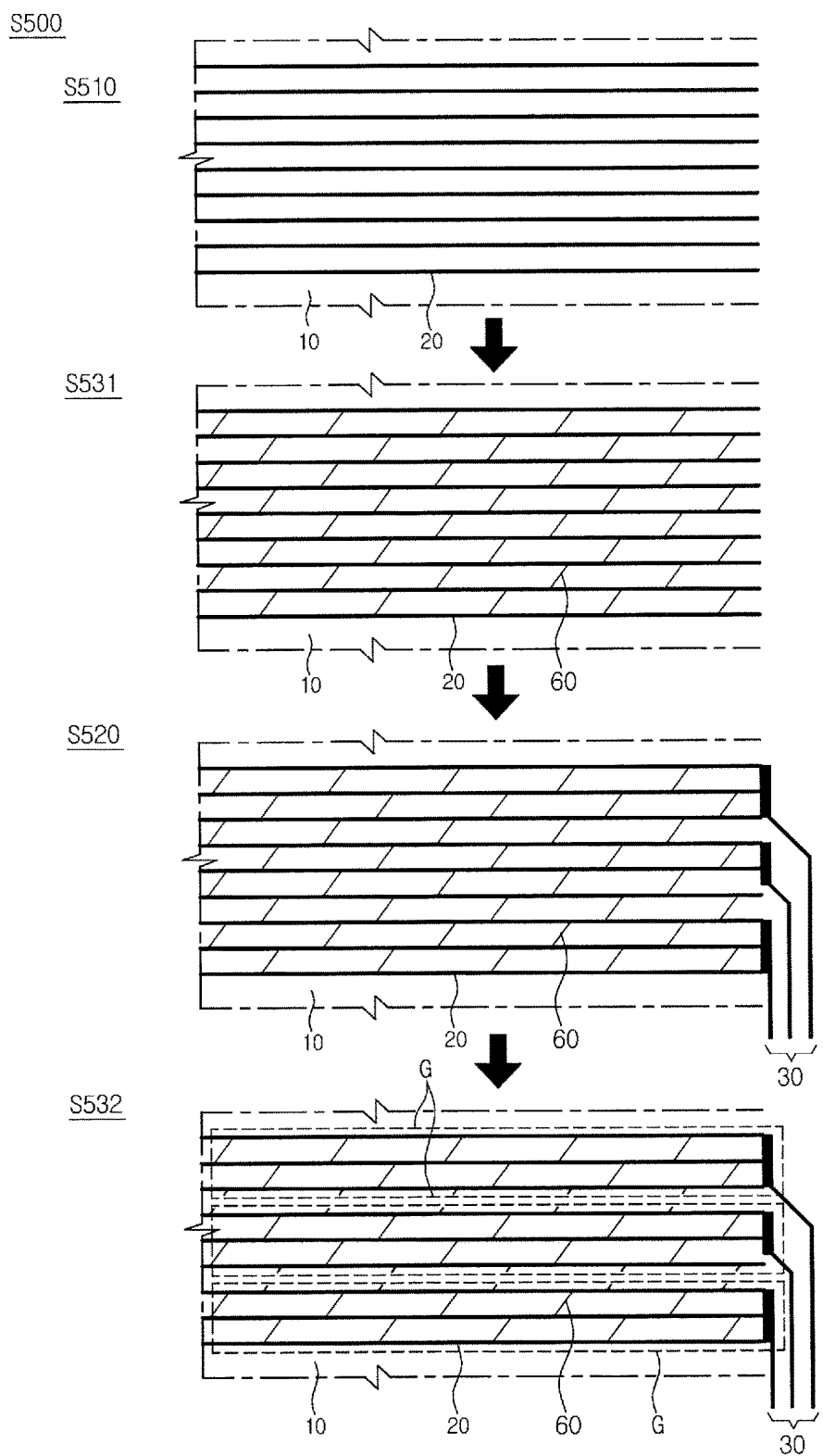
[FIG. 11]

[FIG. 12]
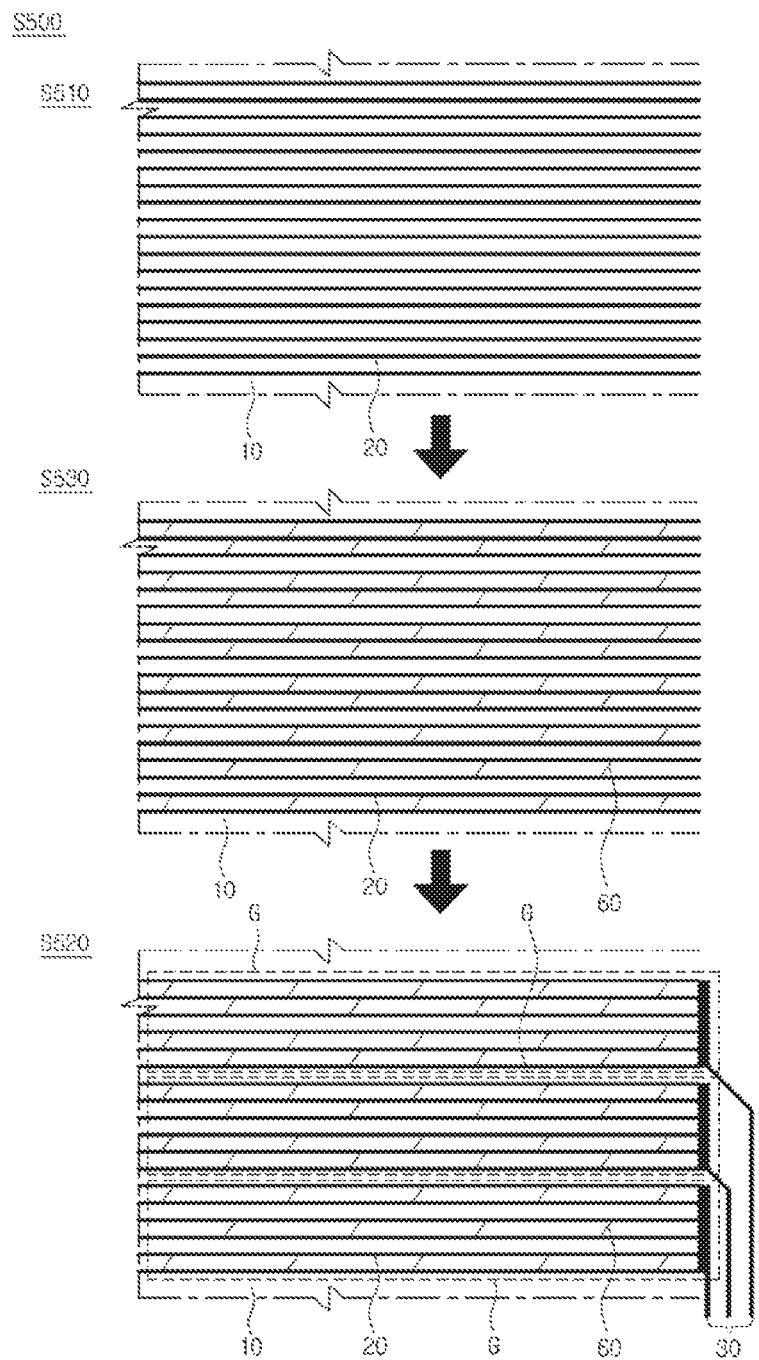

CONDUCTIVE TRANSPARENT SUBSTRATE MANUFACTURING METHOD, AND CONDUCTIVE TRANSPARENT SUBSTRATE

BACKGROUND

1. Field

The following description relates to a method for manufacturing a conductive transparent substrate and the conductive transparent substrate, and more particularly, to a method for manufacturing a conductive transparent substrate in a highly efficient production process.

2. Description of Related Art

Recently, as various home electronic appliances and communication devices become digitalized and highly-advanced at a rapid pace, with the rapid expansion in the field of display, techniques for forming a conductive transparent substrate having low resistance and high transmittance are gathering a lot of attention.

The material of such a conductive transparent substrate must be transparent and exhibit low resistance and also exhibit high flexibility so as to be mechanically stable, and have a coefficient of expansion that is similar to that of the substrate so that even when a device made of the conductive transparent substrate is overheated or placed under a high temperature it is not disconnected or cause great changes in the sheet resistance.

Materials that can be currently used for conductive transparent substrates include metallic oxide, CNT (Carbon Nanotubes), graphene, polymer conductor, metal nano wire and the like. Of these materials, the method of using ITO (Indium Tin Oxide) to form a thin film in a vacuum method is most widely used, but since ITO is a ceramic material, it has low resistance against bending or flexing of the substrate, and thus cracks may be easily formed and spread, thereby degrading the properties of the electrode. Furthermore, there is also the problem of difficulty of activation through substitution of a tin dopant, and drawbacks of being amorphous which leads to high sheet resistances. Not only that, the price of indium which is the main material of ITO continues to increase by the rapid expansion of the flat panel display, mobile device, and touch panel markets, and limited reserves of the ITO serves as a problem in cost competitiveness of the transparent conductive film. Therefore, it is very important to develop an alternative material that could solve the problems of ITO electrodes in order to gain a competitive edge in the competition of display technology that is expected to be fierce.

In the case of using polymer conductors, a transparent conductive film is typically produced using materials such as polyacetylene, polypyrole, polyphenol, polyaniline, PEDOT:PSS, and the like, but most of these polymer conductors have problems that they have low dissolubility, the process of forming a transparent conductive film is fastidious, and the energy bandgap shows color below 3 eV. Coating a polymer conductor as a thin film in order to increase the transmittance will increase the sheet resistance which becomes a problem when actually used in a transparent electrode. Furthermore, most of these polymer conductors have insufficient atmospheric stability, which means that they may be rapidly oxidized in the air, thereby reducing the electrical conductivity. Therefore, securing stability is an important factor.

Many studies are being conducted on conductive transparent films where CNT, graphene, and metal nano wire are used, but such conductive transparent films have problems yet to be solved to use as conductive transparent films having low resistance, and thus have not reached the commercialization level.

As a new method to resolve the aforementioned problems, studies are being conducted actively on methods for forming a conductive transparent film of a metal mesh format where a metal with excellent electrical conductivity and mechanical strength is used. A method of forming a fine intaglio groove by an imprinting method and then filling a metal; a method of directly etching a resin layer surface or resin layer with a substrate simultaneously by laser to form a fine groove and then filling a metal layer; a method of vacuum depositing or surface coating a metal and then using a photo etching process, and a method of using a directly printing method such as flexo, gravure, gravure offset, reverse offset, and inkjet printing are being studied.

However, these methods have numerous limitations in realizing a fine line width, productivity problem by many processes, and efficiency problem of the need to produce a subject transcriptome according to the structure of a transparent electrode area and the like.

Therefore, it is necessary to study a method for producing a conductive transparent substrate that could overcome the limitations of conventional techniques.

SUMMARY

Therefore, a purpose of the present disclosure is to resolve the problems of conventional techniques, that is to provide a method for manufacturing a conductive transparent substrate having excellent transmittance in a process of high yield, and the conductive transparent substrate.

According to an aspect of the present disclosure, there is provided a method for manufacturing a conductive transparent substrate, the method including forming a plurality of main electrodes on the substrate such that the main electrodes are distanced from one another; and forming a connecting electrode that electrically connects two or more main electrodes such that the plurality of main electrodes are grouped into a plurality of group electrodes that are electrically disconnected from one another.

At the forming of a connecting electrode, a connecting electrode pattern may be printed, or a connecting electrode layer may be formed and then a portion of the connecting electrode layer is removed or insulated thereby forming a connecting electrode, such that the main electrodes that are distanced and electrically disconnected from one another are electrically connected but that two or more of the main electrodes are grouped and the grouped main electrodes are disconnected from one another.

The forming of a connecting electrode may include depositing a conductive layer having electrical conductivity on the substrate; and patterning the conductive layer such that the connecting electrode is formed.

The forming of a connecting electrode may include removing a portion of the main electrode; and printing a conductive composition such that a connecting electrode that connects an end of the main electrode is formed.

The forming of a connecting electrode may include connecting a connecting electrode that connects the main electrode; and electrically disconnecting a portion of a section of the main electrode in order to electrically disconnect the main electrodes included in different groups.

The electrically disconnecting may include selectively applying an etchant on an area of the main electrode that needs to be disconnected and etching the main electrode; and washing the etchant.

The electrically disconnecting may include mixing an etchant and an insulating solution; and applying the mixed solution on an area of the main electrode that needs to be disconnected to remove a portion of a section of the main electrode and at the same time form an insulated portion on the removed portion.

The method may further include forming an auxiliary electrode that connects adjacent main electrodes included in one group electrode in order to improve the electrical conductivity in the group electrode.

The method may further include removing the auxiliary electrode formed between adjacent group electrodes after the forming of a connecting electrode.

The forming a main electrode may include forming a groove on the substrate; and filling a conductive ink composition in the groove to form the main electrode.

The forming a main electrode may include printing the main electrode pattern on a release film using a conductive ink composition; forming an insulating layer by applying an insulating resin on the release film where the main electrode pattern is formed; and depositing a substrate on the insulating layer to form a substrate layer; and removing the release film.

The conductive ink composition may include one or more selected from a metal complex compound, metal precursor, metal plate or metal nano particle, carbon nanotube (CNT), and graphene.

The main electrode may be formed in straight line form or in a waveform or triangular waveform, or in mixed form of waveform and triangular waveform.

The main electrode may have a form such that it is repeated with a predetermined cycle.

The main electrodes formed to be adjacent to one another on the substrate may have different phases.

At the patterning the conductive layer, the conductive layer may be etched using laser.

According to another aspect of the present disclosure, there is provided a conductive transparent substrate including a substrate; and a plurality of main electrodes arranged on the substrate such that the main electrodes are distanced from one another; and a connecting electrode that electrically connects two or more main electrodes such that the plurality of main electrodes are grouped into a plurality of group electrodes that are electrically disconnected from one another.

The substrate may further include an auxiliary electrode that connects the main electrodes belonging to a same group electrode.

The auxiliary electrode may have a diagonal form.

According to the present disclosure, there is provided a method for manufacturing a conductive transparent substrate having high transmittance by forming a main electrode first and then connecting a connecting electrode that connects the main electrodes, and the conductive transparent substrate.

Furthermore, it is possible to easily realize intended electrical characteristics by controlling the number of main electrodes to be connected to configure a group electrode according to design.

Furthermore, it is possible to improve observability characteristics such as pattern observability or Moire phenomenon by human eyes by arranging the main electrodes adjacent to one another in different phases according to design.

An electrode may be formed using a conductive ink composition that contains at least one selected from a metal complex compound, metal precursor, metal plate, metal nanoparticle, carbon nanotube (CNT), and graphene. Especially, an electrode formed using a conductive ink composition that contains a metal complex compound and/or metal precursor may reduce the resistance and maintain excellent mechanical characteristics.

Furthermore, by depositing a conductive layer on a portion where connecting electrode is formed, and then patterning the conductive layer, and thereby forming the connecting electrode, it is possible to improve the process yield.

Furthermore, by printing a connecting electrode and then disconnecting the main electrode that electrically connects the connecting electrode, it is easy to prevent group electrodes from being electrically connected.

As aforementioned, according to the present disclosure, in the case of forming main electrodes that are spaced by a certain distance and are thus electrically disconnected and forming a connecting electrode that connects the main electrodes and grouping the main electrodes such that they are electrically connected by as much as necessary electrical characteristics and forming connecting electrodes between the main electrodes such that the grouped main electrodes are disconnected, by patterning or forming the connecting electrode first and then removing or insulating a portion to form the connecting electrode, it is possible to produce a conductive transparent substrate with reduced producing cost, improved process efficiency, and high transmittance.

BRIEF DESCRIPTION OF DRAWINGS

FIG. 1 is a view schematically illustrating a method for producing a conductive transparent substrate according to a first embodiment of the present disclosure;

FIG. 2 is a view illustrating various modified examples of a main electrode produced at a step of forming a main electrode of the method for producing a conductive transparent substrate of FIG. 1;

FIG. 3 is a view illustrating various modified examples of a pattern formed at a patterning step of the method for producing a conductive transparent substrate of FIG. 1;

FIG. 4 is a photograph of a cross-section of a substrate during a process of the method for producing a conductive transparent substrate of FIG. 1;

FIG. 5 is a view schematically illustrating main electrodes formed in a waveform at a step of forming a main electrode (S110) of the method for producing a conductive transparent substrate of FIG. 1;

FIG. 6 is a view schematically illustrating main electrodes formed in a triangular waveform at the step of forming a main electrode (S110) of the method for producing a conductive transparent substrate of FIG. 1;

FIG. 7 is a view schematically illustrating main electrodes formed in a mixed form of waveforms and triangular waveforms at the step of forming a main electrode (S110) of the method for producing a conductive transparent substrate of FIG. 1;

FIG. 8 is a view schematically illustrating a process of a method for producing a conductive transparent substrate according to a second embodiment of the present disclosure;

FIG. 9 is a view schematically illustrating a process of a method for producing a conductive transparent substrate according to a third embodiment of the present disclosure;

FIG. 10 is a view schematically illustrating a process of a method for producing a conductive transparent substrate according to a fourth embodiment of the present disclosure;

FIG. 11 is a view schematically illustrating a process of a method for producing a conductive transparent substrate according to a fifth embodiment of the present disclosure; and FIG. 12 is a view schematically illustrating a modified example of the process of the method for producing a conductive transparent substrate according to the fifth embodiment of the present disclosure.

DETAILED DESCRIPTION

In explaining various embodiments of the present disclosure, a representative embodiment will be explained using like reference numerals to indicate the like components, and in explaining other embodiments, components that are different from the first embodiment will be explained.

First Embodiment

Hereinafter, a method for producing a conductive transparent substrate (S100) according to a first embodiment of the present disclosure will be explained in detail with reference to the drawings attached.

FIG. 1 is a view schematically illustrating a process of a method for producing a conductive transparent substrate according to the first embodiment of the present disclosure, FIG. 2 is a view illustrating various modified examples of a main electrode being produced at a step of forming a main electrode (S110) of the method for producing a conductive transparent substrate of FIG. 1, FIG. 3 is a view illustrating various modified examples of a pattern being formed at a patterning step of a method for producing a conductive transparent substrate, and FIG. 4 is a photograph of a cross-section of a substrate during a process of the method for producing a conductive transparent substrate of FIG. 1.

Referring to FIGS. 1 to 4, the method for producing a conductive transparent substrate (S100) according to the first embodiment relates to a method for producing a conductive transparent substrate with improved efficiency, and this method includes a step of forming a main electrode (S110) and a step of forming a connecting electrode (S120).

The step of forming a main electrode (S110) is a step of forming a plurality of main electrodes 20 to be parallel to one another on a substrate 10, and this step (S110) includes a step of forming a groove and a filling step.

The step of forming a groove is a step of forming a plurality of fine grooves along a path where the main electrodes 20 are to be formed on the substrate 10.

Meanwhile, in the present embodiment, the substrate 10 where the main electrodes 20 are to be formed may be made of any one of a plastic film or glass material, alumina, aluminum oxide, and sapphire. Examples of the plastic film that may be used as the substrate 10 include PEN (Polyethylene Naphthalate), PET (Polyethylene Terephthalate), PE (Polyethylene), PI (Polyimide), and PC (Polycarbonate), but without limitation, and thus a film of various materials well known in the related art may be used.

Furthermore, when necessary, a nontransparent plastic film or glass substrate may be used. The material of the substrate 10 may be determined in consideration of the heat treatment temperature of the conductive ink composition to be filled in the groove to be explained hereinafter.

At the step of forming a groove, a fine groove may be formed on the substrate using a method for imprinting a UV curable resin or thermosetting resin with a mold through an imprinting process, a method for directly etching the substrate with laser, and a photolithography method, and since these methods are well known in the related art, detailed explanation will be omitted. Furthermore, the method for forming a groove on the substrate 10 is not limited to the aforementioned process, and thus various technologies well known in the related art may be used.

At the filling step, an ink composition having electrical conductivity is filled inside the fine groove formed on the substrate 10 so as to form a main electrode 20.

Examples of the method for filling the conductive ink composition into the fine groove of the substrate 10 at the filling step include an inkjet method, flat panel screen method, spin coating method, roll coating method, flow coating method, doctor blade, dispensing, gravure printing method and flexo printing method, but without limitation.

Herein, filling may be performed once, or more than once repeatedly. Filling characteristics may differ depending on each filling method, but it is necessary to adjust the ingredients of the conductive ink composition such that it is suitable to each filling method and optimize the rheology of the composition to the filling method. The conductive ink composition may exhibit different characteristics depending on the metal content, content and volatilization temperature of the solvent, viscosity, and thixotropicity of the conductive ink composition.

Furthermore, after filling the conductive ink composition, by dissolving the conductive ink composition remaining on the surface of the substrate 10 with an etchant solution to re-fill the groove thereby forming the main electrodes 20, it is possible to prevent the conductive ink composition from being wasted unnecessarily.

It is desirable that the thickness of the main electrodes 20 being filled by the aforementioned method is the same as the depth of the intaglio groove or lower than the depth of the intaglio groove formed at the step of forming a groove, but without limitation.

Furthermore, the conductive ink composition used in the present disclosure may be a conductive metal composition including at least one of a metal complex compound, metal precursor, metal plate or metal nano particle, carbon nanotube (CNT), and graphene.

Furthermore, the metal complex compound or metal precursor may be reduced to produce metal particles to be used as a mixed compound. Besides the mixed compound, an additive such as a solvent, stabilizer, dispersant, binder resin, reducing agent, surfactant, wetting agent, thixotropic agent or leveling agent, and viscosity agent may be further included.

Therefore, according to this step, a plurality of main electrodes 20 are arranged on the substrate such that they are distanced from one another in parallel.

Furthermore, it was explained so far that the main electrodes 20 are formed in a straight line form, but as illustrated in FIG. 2, the main electrodes 20 may be arranged such that they are repeated in a prism form (see FIG. 2(b), or in a waveform (see FIG. 2(a)).

Furthermore, since the main electrodes 20 are arranged parallel to one another on the substrate in plural number, each being repeated in a waveform (see FIG. 2(a)) or prism form (see FIG. 2(b)), the main electrodes 20 may all have a same phase or at least adjacent main electrodes 20 may have different phases.

FIG. 5 is a view schematically illustrating main electrodes formed in waveforms at the step of forming a main electrode (S110) of the method for producing a conductive transparent substrate of FIG. 1, FIG. 6 is a view schematically illustrating main electrodes formed in triangular waveforms at the step of forming a main electrode (S110) of the method for producing a conductive transparent substrate of FIG. 1 (S110), and FIG. 7 is a view schematically illustrating main electrodes formed in a mixed form of waveform and triangular form at the step of forming a main electrode (S110) of the method for producing a conductive transparent substrate of FIG. 1.

Referring to FIGS. 5 to 7, main electrodes 20 adjacent to one another may be arranged in a waveform, triangular waveform, or in a mixed form thereof, but each may have different phases, for example, one having a faster or latter phase than the other.

Desirably, a phase difference between the main electrodes 20 that are adjacent to one another may be a ½ cycle. As such, in the case where the phase difference between the main electrodes 20 that are adjacent to one another is a ½ cycle, if one main electrode 20a of the main electrodes 20 that are adjacent to one another is located on a ridge, the other one of the main electrode 20a will be located on a valley, and thus the distance between the two main electrodes may be maximum, and if one main electrode 20b of the main electrodes 20 adjacent one another is located on a valley, the other main electrode 20b of the main electrode 20 will be located on a ridge, and thus the distance between the two main electrodes may be minimum.

Of course, the phase between the main electrodes 20 that are adjacent to one another may be adjusted when necessary, and thus there is no limitation to the aforementioned.

Furthermore, the format and arrangement of the main electrodes 20 are not limited to the aforementioned, and thus the main electrode 20 may be designed in various formats in consideration of the usage and environment of the conductive transparent substrate to be finally manufactured.

Furthermore, it is desirable to determine the line width of the main electrodes 20 to be formed on the substrate 10 and the distance between the main electrodes 20 adjacent to one another in comprehensive consideration of the transmittance and resistance to be realized.

Meanwhile, it was explained that at the step of forming a main electrode according to the present embodiment, a fine groove is formed on the substrate 10 and a conductive composition is filled in the fine groove, but there is no limitation thereto, and thus a main electrode may be printed directly on the substrate surface in a gravure printing method, flexo printing method, offset printing method, reverse offset printing method, dispensing, screen printing method, rotary screen printing method, or inkjet printing method. Otherwise, the main electrodes 20 may be formed on the substrate 10 in a photo-etching method. Otherwise, the main electrodes 20 may be formed on the substrate by printing an electrode pattern on a releasing film, and then applying a UV curable resin on top of the printed pattern, then applying a substrate on top of the UV curable resin layer, and then removing the releasing film, thereby forming the main electrodes 20.

The step of forming a connecting electrode (S120) is a step of forming a connecting electrode 30 that electrically connects two or more main electrodes 20 in order to form a group electrode (G), and this step includes a depositing step (S121) and a patterning step (S122).

Meanwhile, in the present disclosure, a group electrode (G) means a group of a plurality of main electrodes 20 electrically connected to one another by one connecting electrode 30 so as to exhibit necessary electrical characteristics.

The depositing step (S121) is a step of depositing a conductive layer 40 having electrical conductivity on the substrate 10.

This step is a step of depositing a conductive layer 40 having electrically excellent conductivity on a portion of the substrate 10. The conductive layer 40 forms a connecting electrode 30 by the patterning step (S122) that will be explained hereinafter. Meanwhile, the same conductive ink composition used as the main electrodes 20 at the step of forming a main electrode (S110) is used as the material for the conductive layer 40, and thus repeated explanation will be omitted.

The patterning step (S122) is a step of patterning the conductive layer 40 to form a pattern (e), thereby finally forming the connecting electrode 30.

At this step, the conductive layer 40 is patterned such that the connected state of the main electrodes 30 forming a group electrode (G) is maintained by the conductive layer 40, but that the main electrodes 30 belonging to different group electrodes (G) are disconnected.

For example, by printing an electrical insulating resin on an area surrounding the connecting electrode 30 and UV curing or thermosetting the same to form an insulating layer, the connecting electrode 30 may be electrically disconnected from the main electrodes 20 included in different group electrodes (G).

In other words, by printing a connecting electrode 30 again on top of a surface where the electrical insulating resin is printed on top of the main electrode 20, the connecting electrode 30 may be formed such that the main electrodes 20 included in a same group electrode (G) are electrically connected to the substrate 10 through the connecting electrode 30.

Herein, the connecting electrode 30 may be printed after applying or printing a reactive high resistance ink composition instead of the electrical insulating resin.

Herein, the patterning of the conductive layer 40 is performed using laser beam having the amount of energy to sufficiently gasify or decompose the conductive layer 40, whereby the conductive layer 40 may be patterned in line width of various sizes depending on the wavelength of the laser beam. The line width of the pattern (e) may be reduced to a minimum line width that is directly patternable by a general laser beam. The minimum line width may be as small as several sub micrometers and a maximum line width may be as large as several hundred microcrons according to laser equipments.

Meanwhile, the pattern (e) produced by the patterning step (S122) may have a straight line form as illustrated in FIG. 1, or a form where an end of a line has a relatively larger width as illustrated in FIG. 3(a), or a form where an end of a line gradually becomes smaller as illustrated in FIG. 3(b), but without limitation.

Furthermore, by adjusting the output energy of the laser beam, it is possible to adjust the shape of the pattern (e). In order to adjust the shape of the beam to be advantageous to the pattern (e) when using the laser beam, it is possible to form the pattern (e) partially using an optical diffraction device or mask.

Laser media that may be used in the present disclosure include gas, solid-state media and the like. More specifically, gas media such as He—Ne, $CO_2$, Ar, Excimer and the like, and solid-state media such as Nd:YAG, Nd:YVO4, Ytterbium fiber and the like may be used. The wavelength of the laser beam to be used may be selected from wavelengths of 1.06 um, 532 nm, 355 nm, 266 nm, and 248 nm depending on the line width to be realized.

Furthermore, floating matter of the conductive layer 40 being generated as the laser is emitted to form the pattern (e) may be removed neatly through a suction process at the same time the laser is being emitted. In some cases, it is possible to form the connecting electrode 30 and then add a separate process of washing and air blowing.

Therefore, according to the aforementioned step of forming a connecting electrode (S120), as the plurality of main electrodes 20 are electrically connected and grouped, group electrodes (G) are formed having the extent of electrical characteristics to be realized. Meanwhile, adjacent group electrodes (G) are electrically separated from one another, and one group electrode (G) may perform the function of a single electrode having the pre-designed extent of electrical characteristics.

Second Embodiment

Hereinafter, a method for producing a conductive transparent substrate (S200) according to a second embodiment of the present disclosure will be explained in detail.

FIG. 8 is a view schematically illustrating a process of a method for producing a conductive transparent substrate according to a second embodiment.

Referring to FIG. 8, the method for producing a conductive transparent substrate (S200) according to the second embodiment of the present disclosure relates to a process for producing a conductive transparent substrate with improved efficiency, the method including a step of forming a main electrode (S210) and a method of forming a connecting electrode (S220).

However, the step of forming a main electrode of the present embodiment (S210) is the same as the process of forming a main electrode explained with reference to the first embodiment (S110), and thus repeated explanation will be omitted.

The step of forming a connecting electrode (S220) is a step of forming a connecting electrode 30 that electrically connects two or more main electrodes 20 in order to form a group electrode (G), and this step includes a removing step (S221) and a printing step (S222).

The removing step (S221) is a step of removing an end of the main electrode 20. At this step, an end of the main electrode 20 can be removed by etching. Herein, the etching process of this step is a well known method in the related art, and thus detailed explanation is omitted.

The printing step (S222) is a step of forming a connecting electrode 30 on an area of the substrate 10 from which the main electrode 20 has been removed, thereby electrically connecting a plurality of main electrodes 20 to have pre-designed electrical characteristics to form a group electrode (G).

Herein, unlike in the first embodiment, the connecting electrode 30 is printed on a space from which the main electrode 20 has been removed to have a fine line width, thereby connecting ends of the main electrodes 20, and adjacent connecting electrodes 30 arranged to be distanced from one other and thus electrically separated from one another.

Examples of printing the connecting electrode 30 at this printing step (S222) include a gravure printing method, flexo printing method, offset printing method, reverse offset, dispensing, screen printing method, rotary screen printing method, and inkjet method, but without limitation, and thus other various methods may be used.

Therefore, according to the present embodiment, printing is performed directly without a process of forming a separate conductive layer, and thus, a conductive transparent substrate may be produced in a faster process than the process of the first embodiment.

Third Embodiment

Hereinafter, a method for producing a conductive transparent substrate (S300) according to a third embodiment of the present disclosure will be explained in detail.

FIG. 9 is a view schematically illustrating a process of a method for producing a conductive transparent substrate according to the third embodiment of the present disclosure.

Referring to FIG. 9, the method for producing a conductive transparent substrate (S300) according to the third embodiment of the present disclosure relates to a process of producing a conductive transparent substrate with improved efficiency, the method including a step of forming a main electrode (S310), and a step of forming a connecting electrode (S320).

However, the step of forming a main electrode (S310) of the present embodiment is the same as the step of forming a main electrode explained with reference to the first embodiment (S110), and thus repeated explanation is omitted.

The step of forming a connecting electrode (S320) is a step of forming a connecting electrode 30 that electrically connects two or more main electrodes 20 to form a group electrode (G), and this step includes a connecting step (S321) and a disconnecting step (S322).

At the connecting step (S321), a connecting electrode 30 is formed that connects a plurality of main electrodes 20 such that the main electrodes 20 have pre-designed electrical characteristics.

Herein, the connecting electrode 30 formed on the substrate 10 consists of a first electrode 31 that crosses a pre-designed number of main electrodes 20 to connect the main electrodes 20 with one another, and a second electrode 32 for transmitting an electrical signal generated from the first electrode 31 to outside.

Therefore, as the plurality of main electrodes are integrated by the first electrode 31, a group electrode (G) is formed, and the electrical signal generated from the group electrode (G) is transmitted outside from the first electrode 31 via the second electrode 32.

The disconnecting step (S322) is a step of disconnecting a portion of a section of the main electrodes 20 in order to electrically disconnect between connecting electrodes 30.

According to the aforementioned connecting step (S321), the second electrode 32 connected to any one of the group electrode (G) is formed to cross the main electrodes 31 included in an adjacent group electrode (G), and thus a problem occurs where the adjacent group electrodes (G) are electrically connected to one another.

Therefore, in order to resolve this problem, at this step, the main electrodes 20 of an area adjacent to the second electrode 32 are disconnected. In other words, as all the main electrodes 20 in an area between the connecting electrodes 30 arranged adjacent to one another are disconnected, the connecting electrodes 30 that connect different groups through the main electrode 20 are disconnected from the source.

In the present embodiment, an etchant is selectively applied on the main electrode 20 in a position where a disconnection needs to be made, and then the etchant is washed, thereby removing the main electrode 20 in the position where a disconnection needs to be made. Herein, the selective application of the etchant may be made through a mask.

Therefore, according to present embodiment, a group electrode is formed having desired extent of electrical characteristics by the selective application of the etchant at the same time of printing the connecting electrode 30, the group electrodes (G) are electrically disconnected.

Fourth Embodiment

Hereinafter, a method for producing a conductive transparent substrate according to a fourth embodiment of the present disclosure will be explained in detail.

FIG. 10 is a view schematically illustrating a process of the method for producing a conductive transparent substrate according to the fourth embodiment of the present disclosure.

Referring to FIG. 10, the method for producing a conductive transparent substrate according to the fourth embodiment of the present disclosure (S400) relates to a process of producing a conductive transparent substrate with improved efficiency, and this method includes a step of forming a main electrode (S410) and a step of forming a connecting electrode (S420).

However, the step of forming a main electrode (S410) of this embodiment is the same as the step of forming a main electrode explained in the first embodiment (S110) and thus repeated explanation is omitted.

The step of forming a connecting electrode (S420) is a step of forming a connecting electrode 30 that electrically connects two more main electrodes 20 to form a group electrode (G), and this step includes a connecting step (S421) and a disconnecting step (S422).

At the connecting step (S421), a connecting electrode 30 is formed that connects a plurality of main electrodes 20 such that they have pre-designed electrical characteristics.

Herein, the connecting electrode formed on the substrate consists of a first electrode 31 that crosses a predetermined number of main electrodes 20 and connects the main electrodes 20 with one another, and a second electrode 32 for transmitting an electrical signal generated from the first electrode 31 to outside.

Therefore, as a plurality of main electrodes 20 are integrated by the first electrode 31, a group electrode (G) is formed, and the electrical signal generated from the group electrode (G) is sent outside via the first electrode 31 and the second electrode 32.

The disconnecting step (S422) is a step of disconnecting a portion of a section of the main electrode 20 in order to electrically disconnect the connecting electrodes 30.

According to the aforementioned connecting step process, the second electrode 32 connected to any one of the group electrode (G) is formed to cross the main electrodes 31 included in an adjacent group electrode (G), and thus there occurs a problem where adjacent group electrodes (G) are electrically connected to one another.

Therefore, in order to resolve this problem, at this step, the main electrode 20 in an area adjacent to the second electrode 32 is disconnected. In other words, as all the main electrodes 20 in an area between the connecting electrodes 30 arranged adjacent to one another are disconnected, the connecting electrodes 30 that connect different groups through the main electrode 20 are disconnected from the source.

In this embodiment, a reactive high resistance ink composition wherein an etchant and insulating composition are mixed at the same time is applied on the main electrode 20 in a position where a disconnection is necessary. When the reactive high resistance ink composition is applied on the main electrode 20, the etchant included in the reactive high resistance ink composition reacts with the main electrode 20 and is dissolved, and the dissolved main electrode 20 is evenly mixed with the insulating composition and melted, thereby forming a high resistance insulating layer 50. Therefore, in this embodiment, as the insulating layer 50 is formed on a section of the main electrode 20 that needs to be disconnected, the insulating effect may be further improved than the case of selectively applying only the etchant as in the third embodiment.

Meanwhile, the reactive high resistance ink composition of the present disclosure may be produced by adding a titanium group or zirconium group complex compound, solvent, leveling agent, thickening agent, or other types of organic metal complex compounds, and when necessary, an organic polymer material, into a metal etchant solution explained in Korean Patent Publication no. 2006-0106087 filed by the applicant of the present disclosure. Herein, more particularly, the etchant solution may be provided by adding at least one of a titanium group or zirconium group complex compound, solvent, leveling agent, thickening agent, other types of organic material, and organic polymer material into an etchant composition that includes one or more ammonium compound and oxidizing agent selected from chemical formula 1, chemical formula 2, and chemical formula 3 below.

[Chemical formula 1]
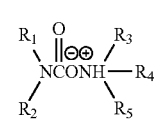

[Chemical formula 2]
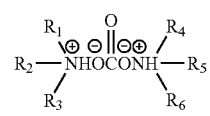

[Chemical formula 3]
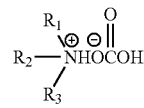

The titanium or zirconium group complex compound that may be used herein may be isopropyl titanate, ethyl titanate, n-butyl titanate, poly-N-butyl titanate, 2-ethylhexyl titanate, n-propyl titanate, octylglycol titanate, tetra isooctyl titanate, xyl titanate monomer, xyl titanate polymer, tiriethanolamine titanate, titanium acetyl acetonate, ethyl acetoacetic ester titanate, isosteroyl titante, titanium lactate kilate, triethanolamine zirconate, zirconium lactate, zirconium glycorate, n-butyl zirconate, or n-propyl zirconate and the like. Two or more of these compounds may be mixed and used when necessary.

The organic polymer material may be poly carbonate, poly acrylate, polymethylmetacrylate, celluloseacetate, polyvinylchloride, polyurethane, polyester, alkyd resin, epoxy resin, phenoxy resin, melamine resin, phenol resin, phenol modified alkyd resin, epoxy modified alkyd resin, vinyl modified alkyd resin, silicone modified alkyd resin, acryl melamine resin, poly isocyanate resin, or epoxy ester resin, but without limitation.

Therefore, according to the present embodiment, it is possible to form a group electrode (G) having the desired extent of electrical characteristics by printing a connecting electrode and at the same time selectively applying a reactive high resistance ink composition, but electrically disconnect the group electrodes (G), and the insulating effect will be further improved through the insulating layer 50 formed on the main electrode 20.

Fifth Embodiment

Hereinafter, a method for producing a conductive transparent substrate according to a fifth embodiment of the present disclosure will be explained in detail.

FIG. 11 is a view schematically illustrating a process of the method for producing a conductive transparent substrate according to the fifth embodiment of the present disclosure, and FIG. 12 is a view schematically illustrating a modified example of a process of the method for producing a conductive transparent substrate according to the fifth embodiment of the present disclosure.

Referring to FIGS. 11 and 12, the method for producing a conductive transparent substrate according to the fifth embodiment of the present disclosure (S500) is a method for producing a conductive transparent substrate with improved efficiency, and this method includes a step of forming a main electrode (S510), a step of forming a connecting electrode (S520), and a step of forming an auxiliary electrode (S530).

However, the step of forming a main electrode (S510) and the step of forming a connecting electrode (S520) are the same as the processes explained in the first to fourth embodiments, and thus repeated explanation will be omitted.

The step of forming an auxiliary electrode (S530) is a step of printing an auxiliary electrode 60 that connects adjacent main electrodes 20 in order to prepare against defects such as not being able to exhibit the designed electrical characteristics due to a problem in the printing quality of the main electrodes, and to increase production yield and to make the resistances of the main electrodes 20 uniform.

That is, the auxiliary electrode 20 diagonally connects the main electrodes 20 included in the same group electrode, but such an auxiliary electrode 20 is not formed between adjacent group electrodes (G).

Meanwhile, as illustrated in FIG. 11, the auxiliary electrode 60 may be formed between all main electrodes 20 before the connecting electrode 30 is formed (S531), and when the connecting electrode 30 is formed to constitute a group electrode (G) (S520), the auxiliary electrode 60 in unnecessary positions may be removed (S532).

Otherwise, as illustrated in FIG. 12, the auxiliary electrode 60 may be formed only between the main electrodes 20 that are predetermined to be included in the same group electrode (G) before the connecting electrode 30 is formed, and then after the connecting electrode 30 is formed, a separate removing process may not be performed.

Therefore, since it is difficult to realize the necessary electrical characteristics from the group electrode (G) constituted by the connecting electrode 30 if an unintended disconnected section occurs in the main electrode 30 during the process of the step of forming a main electrode (S610), the auxiliary electrode 60 is formed between the main electrodes 20 included in the same group electrode (G), thereby preventing defects from occurring and reducing the linear resistance deviation.

Meanwhile, it was explained with reference to the aforementioned first to fifth embodiments and drawings that three main electrodes 20 form a group electrode (G), but there is no limitation thereto, and thus various number of main electrodes 20, for example of two or more may of course form a group electrode (G).

While this disclosure includes desirable embodiments of the present disclosure various changes in form and details may be made in these embodiments without departing from the spirit and scope of the claims and their equivalents. Therefore, the aforementioned description of the present disclosure does not limit the scope of the present disclosure defined by the limitations of the claims.

INDUSTRIAL APPLICABILITY

It is possible to provide a method for manufacturing a conductive transparent substrate having high transmittance through a process of high yield and the conductive transparent substrate of the same method.

What is claimed is:

1. A method for manufacturing a conductive transparent substrate, the method comprising:
   a main electrode forming step of manufacturing a plurality of main electrodes arranged on a substrate in such a manner that the plurality of main electrodes are spaced apart from each other; and
   a connecting electrode forming step of manufacturing a connecting electrode electrically connecting at least two main electrodes in such a manner that the plurality of main electrodes are grouped as a plurality of group electrodes and the plurality of group electrodes are electrically isolated from each other,
   wherein at the connecting electrode forming step, a connecting electrode pattern is printed, or a connecting electrode layer is formed and then a portion of the connecting electrode layer is removed or insulated, thereby forming the connecting electrode, such that the main electrodes that are distanced and electrically disconnected from one another are electrically connected but that two or more of the main electrodes are grouped and the grouped main electrodes are disconnected from one another.

2. The method according to claim 1, further comprising:
   forming an auxiliary electrode that connects adjacent main electrodes included in one group electrode in order to improve the electrical conductivity in the group electrode.

3. The method according to claim 2, further comprising:
   removing the auxiliary electrode formed between adjacent group electrodes after the connecting electrode forming step.

4. The method according to claim 1, wherein the main electrode forming step comprises:
   forming a groove on the substrate; and
   filling a conductive ink composition in the groove to form the main electrode.

5. The method according to claim 4, wherein the conductive ink composition includes one or more selected from a metal complex compound, metal precursor, metal plate or metal nano particle, carbon nanotube (CNT), and graphene.

6. The method according to claim 1, wherein the main electrode forming step comprises:
   printing a main electrode pattern on a release film using a conductive ink composition;

forming an insulating layer by applying an insulating resin on the release film where the main electrode pattern is formed;
depositing a substrate on the insulating layer to form a substrate layer; and
removing the release film.

7. The method according to claim 6,
wherein the conductive ink composition includes one or more selected from a metal complex compound, metal precursor, metal plate or metal nano particle, carbon nanotube (CNT), and graphene.

8. The method according to claim 1,
wherein the main electrode is formed in straight line form or in a waveform or triangular waveform, or in mixed form of waveform and triangular waveform.

9. The method according to claim 8,
wherein the main electrode has a form such that it is repeated with a predetermined cycle.

10. The method according to claim 9,
wherein the main electrodes formed to be adjacent to one another on the substrate have different phases.

11. A method for manufacturing a conductive transparent substrate, the method comprising:
a main electrode forming step of manufacturing a plurality of main electrodes arranged on a substrate in such a manner that the plurality of main electrodes are spaced apart from each other; and
a connecting electrode forming step of manufacturing a connecting electrode electrically connecting at least two main electrodes in such a manner that the plurality of main electrodes are grouped as a plurality of group electrodes and the plurality of group electrodes are electrically isolated from each other,
wherein the connecting electrode forming step comprises:
depositing a conductive layer having electrical conductivity on the substrate; and
patterning the conductive layer such that the connecting electrode is formed.

12. The method according to claim 11,
wherein at the patterning the conductive layer, the conductive layer is etched using a laser.

13. A method for manufacturing a conductive transparent substrate, the method comprising:
a main electrode forming step of manufacturing a plurality of main electrodes arranged on a substrate in such a manner that the plurality of main electrodes are spaced apart from each other; and
a connecting electrode forming step of manufacturing a connecting electrode electrically connecting at least two main electrodes in such a manner that the plurality of main electrodes are grouped as a plurality of group electrodes and the plurality of group electrodes are electrically isolated from each other,
wherein the connecting electrode forming step comprises:
removing a portion of the main electrode; and
printing a conductive composition such that the connecting electrode that connects an end of the main electrode is formed.

14. A method for manufacturing a conductive transparent substrate, the method comprising:
a main electrode forming step of manufacturing a plurality of main electrodes arranged on a substrate in such a manner that the plurality of main electrodes are spaced apart from each other; and
a connecting electrode forming step of manufacturing a connecting electrode electrically connecting at least two main electrodes in such a manner that the plurality of main electrodes are grouped as a plurality of group electrodes and the plurality of group electrodes are electrically isolated from each other,
wherein the connecting electrode forming step comprises:
connecting the connecting electrode that connects the main electrode; and
electrically disconnecting a portion of a section of the main electrode in order to electrically disconnect the main electrodes included in different groups.

15. The method according to claim 14,
wherein the electrically disconnecting comprises:
selectively applying an etchant on an area of the main electrode that needs to be disconnected and etching the main electrode; and
washing the etchant.

16. The method according to claim 14,
wherein the electrically disconnecting comprises:
mixing an etchant and an insulating solution; and
applying the mixed solution on an area of the main electrode that needs to be disconnected to remove a portion of a section of the main electrode and at the same time form an insulated portion on the removed portion.

17. A conductive transparent substrate comprising:
a substrate;
a plurality of main electrodes arranged on the substrate such that the main electrodes are distanced from one another;
a connecting electrode that electrically connects two or more main electrodes such that the plurality of main electrodes are grouped into a plurality of group electrodes that are electrically disconnected from one another; and
an auxiliary electrode that connects the main electrodes belonging to a same group electrode.

18. The substrate according to claim 17,
wherein the auxiliary electrode has a diagonal form.

* * * * *